United States Patent [19]
Masuoka

[11] Patent Number: 5,733,792
[45] Date of Patent: Mar. 31, 1998

[54] MOS FIELD EFFECT TRANSISTOR WITH IMPROVED POCKET REGIONS FOR SUPPRESSING ANY SHORT CHANNEL EFFECTS AND METHOD FOR FABRICATING THE SAME

[75] Inventor: Sadaaki Masuoka, Tokyo, Japan

[73] Assignee: NEC Corporation, Tokyo, Japan

[21] Appl. No.: 688,266

[22] Filed: Jul. 29, 1996

[30] Foreign Application Priority Data

Jul. 28, 1995 [JP] Japan ................... 7-193347

[51] Int. Cl.$^6$ .................................. H01L 21/266
[52] U.S. Cl. .................. 437/35; 437/44; 437/158; 437/947
[58] Field of Search ................. 437/35, 44, 89, 437/149, 157, 158, 947, 981; 148/DIG. 161

[56] References Cited

U.S. PATENT DOCUMENTS

| | | | |
|---|---|---|---|
| 4,377,899 | 3/1983 | Otani et al. | 437/35 |
| 5,158,901 | 10/1992 | Kosa et al. | 437/35 |
| 5,444,007 | 8/1995 | Tsuchiaki | 437/947 |

*Primary Examiner*—Chandra Chaudhari
*Attorney, Agent, or Firm*—Young & Thompson

[57] ABSTRACT

A method for ion-implantation of a first conductivity impurity into a substrate of the same conductivity type to form pocket regions at positions in the inside edge portion of source/drain regions of a second conductivity type in a MOSFET having gate electrodes with side wall silicon oxide films. Semiconductor epitaxial layers are formed on the source/drain regions of a high selectivity to the side wall oxide films so that the epitaxial layers have facets which face to the side wall oxide films and the facets are almost linearly sloped down to bottom portions of the side wall oxide films. The first conductivity type impurity is implanted into the substrate at its limited positions in the vicinity of the inside edge portion of the source/drain regions by using the epitaxial layers with the facets and the side wall oxide films as masks in an oblique direction tilted by a tilting angle θ from the normal of a surface of the substrate, wherein the angle θ satisfies an equation represented by $\theta \leq \theta_1$ where: $\theta_1$ is an angle by which the facets are tilted from the normal of the surface substrate, and a thickness of the silicon selective growth layers satisfies an equation Tepi>(Xj'/tan θ)−Xj where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall oxide films.

9 Claims, 3 Drawing Sheets

MOS FIELD EFFECT TRANSISTOR WITH IMPROVED POCKET REGIONS FOR SUPPRESSING ANY SHORT CHANNEL EFFECTS AND METHOD FOR FABRICATING THE SAME

BACKGROUND OF THE INVENTION

The present invention relates to a MOS field effect transistor with improved pocket regions for suppressing any short channel effects and a method for forming the pocket regions in the MOS field effect transistor.

Figure 1:
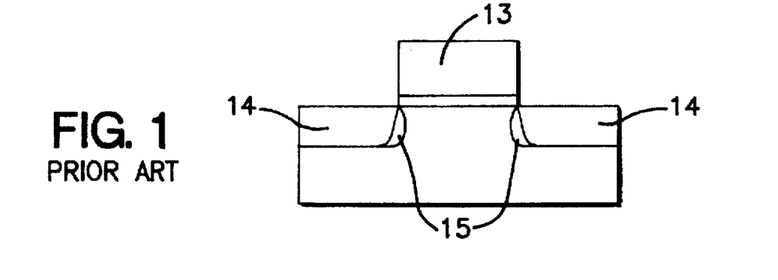
FIG. 1 is a fragmentary cross sectional elevation view illustrative of a MOS field effect transistor with pocket regions fabricated by the conventional ion-implantation technique.

Whereas a possible large scale down of the MOS field effect transistor has now been required, such large scale down contributes to cause any short channel effects such as a drop of the threshold voltage of the MOS field effect transistor and a punch through. In order to suppress these short channel effects, it was proposed to provide pocket structures between a source or drain region and a channel region under a gate electrode. Such pocket structure is, for example, disclosed in S. Ogura et al. 1982 IEDM 82, pp. 718–721 emitted "A HALF MICRON MOSFET USING IMPLANTED LDD". One of the conventional MOS field effect transistor with such pocket structure is illustrated in FIG. 1. Pocket regions 15 are provided in contact with inside edge portions of source/drain diffusion regions 14 so that the pocket regions 15 are positioned under edge portions of a gate electrode 13 and extend from a surface level to a bottom level of the source/drain diffusion regions 14. The pocket regions 15 are doped with an impurity of the same conductivity as of a substrate but opposite to that of the source/drain diffusion regions 14, wherein the pocket regions 15 have a higher impurity concentration than an impurity concentration of the substrate so as to prevent a space charge region from extending from source/drain regions 14 to a channel region under the gate electrode 13 to thereby suppress the short channel effects.

In prior art, such pocket regions were formed as follows.

Figure 2A:
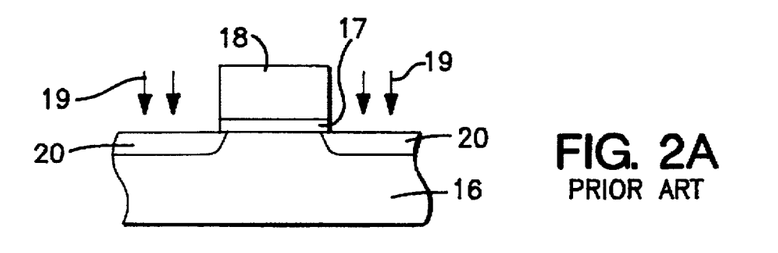
FIGS. 2A and 2B are fragmentary cross sectional elevation views illustrative of MOS field effect transistors with pocket regions in sequential processes involved in the conventional fabrication method.

With reference to FIG. 2A a gate oxide film 17 and a gate electrode 18 made of polysilicon are selectively formed on a p-type substrate 16. The substrate 16 is subjected to an ion implantation for adjusting a threshold voltage. By use of the gate electrode 18 as a mask, the p-type substrate 16 is subjected to an ion implantation so that a p-type impurity is selectively implanted into upper regions of the p-type substrate 16 whereby p-type impurity doped diffusion regions 20 are selectively formed, which have a higher impurity concentration than a concentration of the p-type substrate 16.

Figure 2B:
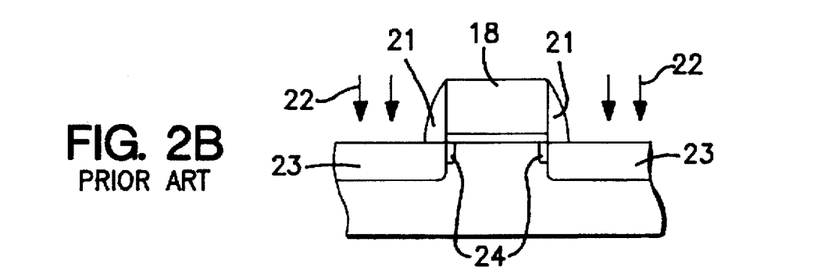

With reference to FIG. 2B, side wall oxide films 21 are selectively formed at opposite sides of the gate electrode 18 so that the gate electrode 18 along with the side wall oxide films 21 are used as a mask for further ion implantation of an n-type impurity 22 at a high dose so that n+-type diffusion regions are formed, which extend in an upper region of the p-type substrate 16 expect under the gate electrode 18 and the side wall oxide films 21, whilst under the side wall oxide films 21, the p-type impurity doped diffusion regions 20 partially and selectively remain. The n+-type diffusion regions are then subjected to a heat treatment to cause diffusion of the n-type impurity 22 so that inside edge portions of the n+-type diffusion regions reach under boundaries of the gate electrode 18 and the side wall oxide films 21. As a result, source/drain diffusion regions 23 are formed, which have inside edge portions positioned under the boundaries of the gate electrode 18 and the side wall oxide films 21, whilst p-type impurity doped pocket regions 24 are formed in contact with the inside edge portions of the source/drain diffusion regions 23. Since the p-type impurity doped pocket regions 24 are formed from parts of the p-type impurity doped diffusion regions 20, the p-type impurity doped pocket regions 24 have a higher impurity concentration than an impurity concentration of the p-type substrate 16. The p-type impurity doped pocket regions 24 vertically extend from a surface level to a lower level of the source/drain diffusion regions 23.

The above method for forming the pocket regions has the following disadvantages. According to the above method, it is essential to form side wall oxide films after the p-type ion implantation but before the n-type ion implantation. In order to form the side wall oxide films, a heat treatment at a high temperature is required, for which reason if the pocket structure is formed for a CMOS semiconductor device, then an additional mask process is required.

In order to omit such additional mask process, it was proposed that the side wall oxide films are formed before an ion implantation for formation of the pocket region and another ion implantation for formation of the source/drain diffusion regions are made. This fabrication method will be described with reference to FIGS. 3A and 3B.

Figure 3A:
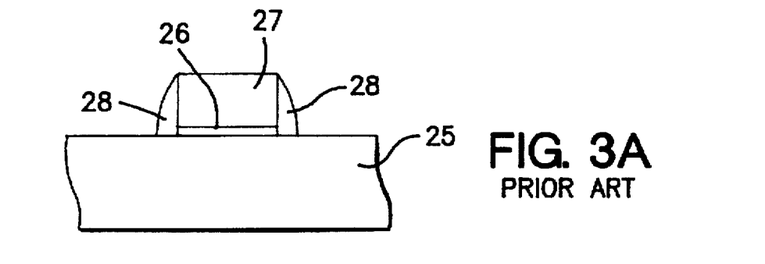
FIGS. 3A and 3B are fragmentary cross sectional elevation views illustrative of MOS field effect transistors with pocket regions in sequential processes involved in the other conventional fabrication method.

With reference to FIG. 3A, a gate oxide film 26 and a gate electrode 27 made of polysilicon are selectively formed on a p-type substrate 25. The substrate 25 is subjected to an ion implantation for adjusting a threshold voltage. Side wall oxide films 28 are selectively formed at opposite sides of the gate electrode 27 so that the gate electrode 27 along with the side wall oxide films 28 are used as a mask for subsequent ion implantation.

Figure 3B:
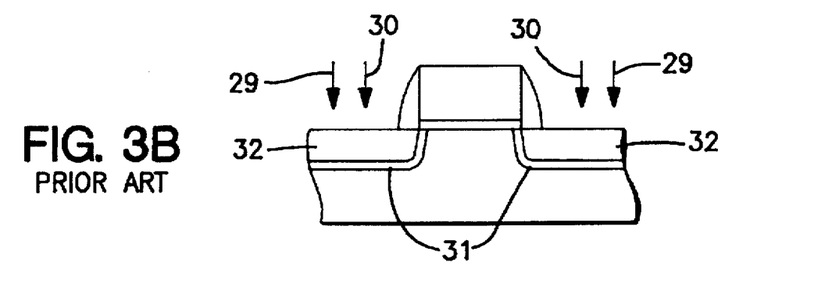

With reference to FIG. 3B, by use of the gate electrode 27 along with the side wall oxide films 28 as a mask, the p-type substrate 25 is subjected to concurrent ion implantation of a p-type impurity 29 and an n-type impurity 30 so that the p-type and n-type impurities are selectively implanted into upper regions of the p-type substrate 25. Subsequently, the substrate is subjected to a heat treatment whereby p-type impurity doped pocket regions 31 and n-type impurity diffusion regions 32 are concurrently formed. The n-type impurity diffusion regions 32 extend in an upper region of the substrate except under the gate electrode 27 and have inside edge portions positioned under boundaries between the gate electrode 27 and the side wall oxide films 28. The p-type impurity doped pocket regions 31 extend in contact with the inside edge portions and bottom portions of the n-type impurity diffusion regions 32 so that the n-type impurity diffusion regions 32 are separated from the p-type substrate 25 by the p-type impurity doped pocket regions 31.

The above method has an advantage in allowing the additional mask process to be omitted but the following disadvantages. The p-type impurity doped pocket regions 31 have a higher impurity concentration than an impurity concentration of the substrate 25 and further extends not only the inside edge portions of the n-type impurity diffusion regions 32 but also the bottom portions thereof. For these reasons, a large p-n junction capacitance is formed between the p-type impurity doped pocket regions 31 and the n-type impurity diffusion regions 32.

In order to avoid formation of the large p-n junction capacitance, it was proposed that the p-type impurity doped pocket regions 31 do not extend under the bottom regions of the n-type impurity diffusion regions 32 even the n-type and p-type impurities are concurrently implanted. This method for forming the pocket regions will then be described with reference to FIGS. 4A and 4B.

Figure 4A:
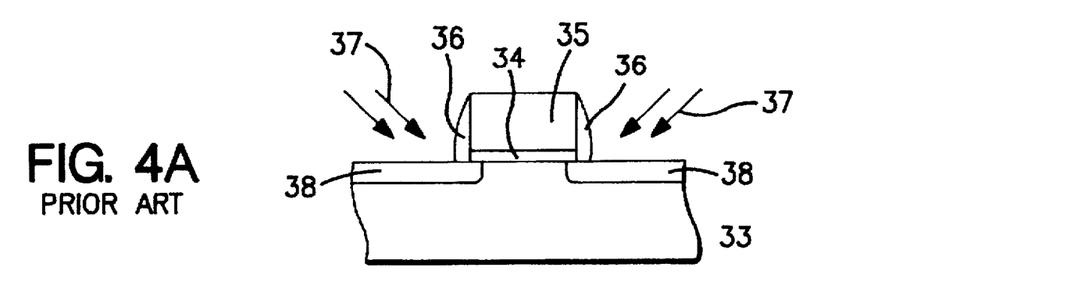
FIGS. 4A and 4B are fragmentary cross sectional elevation views illustrative of MOS field effect transistors with pocket regions in sequential processes involved in the other conventional fabrication method.

With reference to FIG. 4A, a gate oxide film 34 and a gate electrode 35 made of polysilicon are selectively formed on a p-type substrate 33. The substrate 33 is subjected to an ion implantation for adjusting a threshold voltage. Side wall oxide films 36 are selectively formed at opposite sides of the gate electrode 35 so that the gate electrode 35 along with the side wall oxide films 36 are used as a mask for subsequent ion implantation.

Figure 4B:
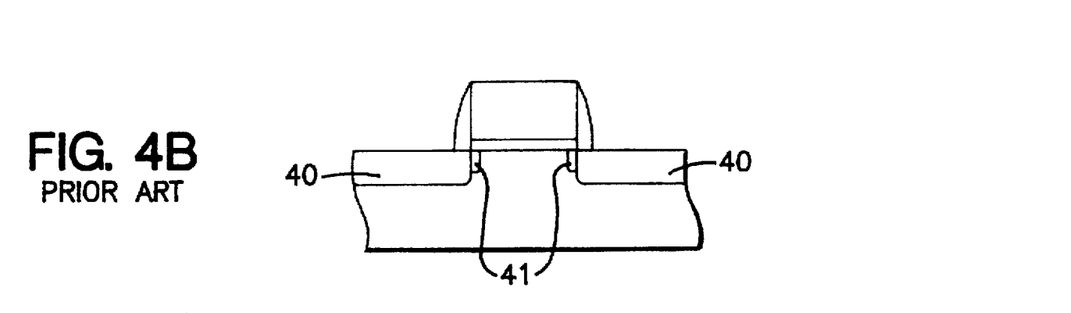

With reference to FIG. 4B, by use of the gate electrode 35 along with the side wall oxide films 36 as a mask, the p-type substrate 33 is subjected to an ion implantation of a p-type impurity 37 in an oblique direction during the rotation of the substrate so that p-type regions 38 are formed in upper portions of the substrate 33. The p-type regions 38 extends under the side wall oxide films 36 and edge portions of the gate electrode 35. Subsequently, by also use of the gate electrode 35 along with the side wall oxide films 36 as a mask, the p-type substrate 33 is subjected to an ion implantation of an n-type impurity 39 in a vertical direction to the surface of the substrate to form n-type source/drain diffusion regions 40 and at the meantime p-type pocket regions 41 are defined in contact with the inside edge portions of the n-type source/drain diffusion regions 40.

The above method uses the oblique ion-implantation to form such shallow pocket regions in contact with the inside edge portions of the source/drain diffusion regions having the opposite conductivity to that of the pocket regions. The pocket regions formed by the oblique ion-implantation are subjected to a heat treatment which is necessary for forming the source/drain regions. As a result, the pocket regions are diffused to extend under bottom portions of the source/drain regions. This results in an enlargement in area of the p-n junction between the source/drain regions and the pocket regions. This further results in an enlargement in a p-n junction capacitance between the source/drain regions and the pocket regions.

Most of the causes of the above problems is in carrying out the ion-implantation to the entire parts of the source/drain regions. In order to solve this problem, it is required to selectively have the impurity be implanted only into upper regions of the substrate but in the vicinity of the inside edge portions of the source/drain regions.

It had been required to develop a novel method for an ion-implantation method to implant an impurity only into upper regions of the substrate but in the vicinity of the inside edge portions of the source/drain regions.

SUMMARY OF THE INVENTION

Accordingly, it is an object of the present invention to provide a novel method for an ion-implantation method to implant an impurity only into upper regions of a substrate but in the vicinity of inside edge portions of source/drain regions to selectively form pocket regions in a MOS field effect transistor.

It is a further object of the present invention to provide a novel method for selectively forming pocket regions in upper regions of a substrate but in the vicinity of inside edge portions of source/drain regions by selective ion-implantation of an impurity only into upper regions of a substrate but in the vicinity of inside edge portions of source/drain regions in a MOS field effect transistor.

It is further more object of the present invention to provide a novel method for forming pocket regions having a small p-n junction capacitance in a MOS field effect transistor.

It is a further object of the present invention to provide a novel method for selectively forming pocket regions in upper regions of a substrate but in the vicinity of inside edge portions of source/drain regions by selective ion-implantation of an impurity only into upper regions of a substrate but in the vicinity of inside edge portions of source/drain regions in a MOS field effect transistor.

It is further more object of the present invention to provide a novel method for forming pocket regions having a small p-n junction capacitance in a MOS field effect transistor.

It is still a further object of the present invention to provide a novel pocket structure formed by an ion-implantation method to implant an impurity only into upper regions of a substrate but in the vicinity of inside edge portions of source/drain regions to selectively form pocket regions in a MOS field effect transistor.

It is still a further object of the present invention to provide a novel pocket structure selectively formed in upper regions of a substrate but in the vicinity of inside edge portions of source/drain regions by selective ion-implantation of an impurity only into upper regions of a substrate but in the vicinity of inside edge portions of source/drain regions in a MOS field effect transistor.

It is yet a further object of the present invention to provide a novel pocket structure having a small p-n junction capacitance in a MOS field effect transistor.

It is another object of the present invention to provide a MOS field effect transistor having a novel pocket structure formed by an ion-implantation method to implant an impurity only into upper regions of a substrate but in the vicinity of inside edge portions of source/drain regions to selectively form pocket regions.

It is still another object of the present invention to provide a MOS field effect transistor having a novel pocket structure selectively formed in upper regions of a substrate but in the vicinity of inside edge portions of source/drain regions by selective ion-implantation of an impurity only into upper regions of a substrate but in the vicinity of inside edge portions of the source/drain regions.

It is still more object of the present invention to provide a MOS field effect transistor with a novel pocket structure having a small p-n junction capacitance in a MOS field effect transistor.

The above and other objects, features and advantages of the present invention will be apparent from the following descriptions.

The present invention, therefore, provides a method for ion-implantation of an impurity of a first conductivity into a substrate of the same conductivity type as the first conductivity to form pocket regions at limited positions in the vicinity of an inside edge portion of source/drain regions of a second conductivity type in a MOS field effect transistor having a gate electrode with side wall silicon oxide films. The method comprises the following steps. Semiconductor epitaxial layers are formed on the source/drain regions under conditions of a high selectivity to silicon oxide of the side wall silicon oxide films so that the semiconductor epitaxial layers have fleets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a tilting angle θ from the normal of a surface of the substrate, wherein the angle θ satisfies an equation represented by $\theta \leq \theta_1$ where: $\theta_1$ is an angle by which the facets are tilted from the normal of the surface of the substrate, and also wherein a thickness of the silicon selective growth layers satisfies an equation represented by $Tepi > (Xj'/\tan \theta) - Xj$ where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall silicon oxide films.

The present invention also provides a method for forming pocket regions of a first conductivity type in a substrate of the first conductivity type at its limited positions in the vicinity of an inside edge portion of source/drain regions of a second conductivity type in a MOS field effect transistor having a gate electrode with side wall silicon oxide films. The method comprises the following steps. Semiconductor epitaxial layers are formed on the source/drain regions under conditions of a high selectivity to silicon oxide of the side wall silicon oxide films so that the semiconductor epitaxial layers have facets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a tilting angle $\theta$ from the normal of a surface of the substrate, wherein the angle $\theta$ satisfies an equation represented by ($\theta \leq \theta_1$ where: $\theta_1$ is an angle by which the facets are tilted from the normal of the surface of the substrate, and wherein a thickness of the silicon selective growth layers satisfies an equation represented by $Tepi > (Xj'/\tan \theta) - Xj$ where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall silicon oxide films.

The present invention also provides a method for fabricating a MOS field effect transistor with pocket regions of a first conductivity type in a substrate of the first conductivity type at its limited positions in the vicinity of an inside edge portion of source/drain regions of a second conductivity type. The method comprises the following steps. A gate electrode is formed on a gate oxide film over a semiconductor substrate. Side wall silicon oxide films are formed at opposite sides of the gate electrode. Source/drain diffusion regions are formed by ion-implantation of an impurity of the second conductivity type into the substrate in a direction vertical to a surface of the substrate by use of the gate electrode and the side wall silicon oxide films as masks. The substrate is subjected to cause an activation of the source/drain diffusion regions and a diffusion of the impurity of the second conductivity type. Semiconductor epitaxial layers are formed on the source/drain regions under conditions of a high selectivity to silicon oxide of the side wall silicon oxide films so that the semiconductor epitaxial layers have facets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a tilting angle $\theta$ from the normal of a surface of the substrate, wherein the angle $\theta$ satisfies an equation represented by $\theta \leq \theta_1$ where: $\theta_1$ is an angle by which the facets are tilted from the normal of the surface of the substrate, and wherein a thickness of the silicon selective growth layers satisfies an equation represented by $Tepi > (Xj'/\tan \theta) - Xj$ where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall silicon oxide films.

The present invention also provides a MOS field effect transistor comprises the following elements. A gate oxide film is selectively provided on the semiconductor substrate of a first conductivity type. A gate electrode is provided on the gate oxide film. Side wall silicon oxide films is selectively formed at opposite sides of the gate electrode. Source/drain diffusion regions of a second conductivity type are provided selectively in an upper region of the semiconductor substrate. Semiconductor epitaxial layers are provided on the source/drain regions. The semiconductor epitaxial layers have facets which face to the side wall silicon oxide films and the facets are almost linearly sloped down to bottom portions of the side wall silicon oxide films. Pocket regions of the first conductivity type extend in the substrate at its limited positions along an inside edge portion of the source/drain regions. The pocket regions have bottoms positioned at a depth, wherein $Xpocket < Tepi + Xj$ where: Tepi is a thickness of the semiconductor selective growth layers except for the facet portions; Xj is a p-n junction depth of the source/drain regions; and Xpocket is a depth at which bottoms of the pocket regions are leveled.

BRIEF DESCRIPTIONS OF THE DRAWINGS

Preferred embodiments according to the present invention will be described in detail with reference to the accompanying drawing.

DISCLOSURE OF THE INVENTION

In accordance with the present invention, by use of a chemical vapor deposition method, silicon selective growth layers are formed on source/drain regions under conditions of a high selectivity to silicon oxide of the side wall silicon oxide films. The silicon selective growth layers have facets which face to side wall silicon oxide films, wherein the facets of the silicon selective growth layers are almost linearly sloped down to the bottom portion of the side wall silicon oxide films. This silicon selective growth layers may be replaced by other semiconductor selective growth layers.

Subsequently, by use of the silicon selective growth layers and the side wall silicon oxide films as masks, the substrate is subjected to an ion-implantation of an impurity of an opposite conductivity type to the source/drain regions at a predetermined implantation energy and a predetermined dose in an oblique direction tilted by a tilting angle θ from the normal of a surface of a substrate to thereby implant the impurity only local and limited portions in the vicinity of inside edge portions of the source/drain regions. The angle θ, by which the direction of the ion-implantation of the impurity is tilted from the normal of the surface of the substrate, has to be decided to satisfy the following equation.

$\theta \leq \theta_1$ where $\theta_1$ is the angle by which the facets of the silicon selective growth layers are tilted from the normal of the surface of the substrate to allow the impurity to be implanted only into positions in the vicinity of the inside edge portions of the source/drain regions.

A thickness Tepi of the silicon selective growth layers is decided to satisfy the following equations.

Tepi>(Xj'/tan θ)−Xj where: Tepi is the thickness of the silicon selective growth layers except for the facet portions; Xj is the junction depth of the source/drain diffusion regions; Xj' is the distance between the top edge portion of each of the source/drain diffusion regions and the bottom side edge of each of the side wall silicon oxide films; and θ is the angle by which the direction of the ion-implantation of the impurity is tilted from the normal of the surface of the substrate. The reason why it is necessary to satisfy the above relationship represented by the above equation is as follows.

First, it is required to implant the impurity only into local and limited positions in the vicinity of the inside edge portions of the source/drain regions so as to form pocket regions only at local and limited positions in the vicinity of the inside edge portions of the source/drain regions. In order to satisfy this requirement, it is required to satisfy the following equation.

Xpocket>Xj'/tan θ where:θ is the angle by which the direction of the ion-implantation of the impurity is tilted from the normal of the surface of the substrate; Xj' is the distance between the top edge portion of each of the source/drain diffusion regions and the bottom side edge of each of the side wall silicon oxide films; and Xpocket is the mean depth of the impurity implanted from the surface of the device.

It is required to satisfy the following equation in order to selectively implant the impurity only into local and limited positions in the vicinity of the inside edge portions of the source/drain regions so as to form the pocket regions only at local and limited positions in the vicinity of the inside edge portions of the source/drain regions.

Xpocket<Tepi+Xj where Tepi is the thickness of the silicon selective growth layers except for the facet portions.

In order to satisfy both the above equations Xpocket>Xj'/tanθ and Xpocket<Tepi+Xj, it is required to satisfy the following equation.

Tepi>(Xj'/tan θ)−Xj.

In accordance with the above implantation method, it is possible to form the pocket regions only at local and limited positions in the vicinity of the inside edge portions of the source/drain regions by using the silicon selective growth layers with the facet portions and the side wall silicon oxide film as masks. This prevents any enlargement in a p-n junction capacitance between the source/drain regions and the pocket regions in the MOS transistor.

The present invention, therefore, provides a method for ion-implantation of an impurity of a first conductivity into a substrate of the same conductivity type as the first conductivity to form pocket regions at limited positions in the vicinity of an inside edge portion of source/drain regions of a second conductivity type in a MOS field effect transistor having a gate electrode with side wall silicon oxide films. The method comprises the following steps. Semiconductor epitaxial layers are formed on the source/drain regions under conditions of a high selectivity to silicon oxide of the side wall silicon oxide films so that the semiconductor epitaxial layers have facets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a tilting angle θ from the normal of a surface of the substrate, wherein the angle θ satisfies an equation represented by $\theta \leq \theta_1$ where: $\theta_1$ is an angle by which the facets are tilted from the normal of the surface of the substrate, and also wherein a thickness of the silicon selective growth layers satisfies an equation represented by Tepi>(Xj'/tan θ)−Xj where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall silicon oxide films.

The present invention also provides a method for forming pocket regions of a first conductivity type in a substrate of the first conductivity type at its limited positions in the vicinity of an inside edge portion of source/drain regions of a second conductivity type in a MOS field effect transistor having a gate electrode with side wall silicon oxide films. The method comprises the following steps. Semiconductor epitaxial layers are formed on the source/drain regions under conditions of a high selectivity to silicon oxide of the side wall silicon oxide films so that the semiconductor epitaxial layers have facets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a lilting angle θ from the normal of a surface of the substrate, wherein the angle θ satisfies an equation represented by $\theta \leq \theta_1$ where: $\theta_1$ is an angle by which the facets are tilted from the normal of the surface of the substrate, and wherein a thickness of the silicon selective growth layers satisfies an equation represented by Tepi>(Xj'/tan θ)−Xj where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the silicon oxide films.

The present invention also provides a method for fabricating a MOS field effect transistor with pocket regions of a first conductivity type in a substrate of the first conductivity type at its limited positions in the vicinity of an inside edge portion of source/drain regions of a second conductivity type. The method comprises the following steps. A gate electrode is formed on a gate oxide film over a semiconductor substrate. Side wall silicon oxide films are formed at opposite sides of the gate electrode. Source/drain diffusion regions are formed by ion-implantation of an impurity of the second conductivity type into the substrate in a direction vertical to a surface of the substrate by use of the gate electrode and the side wall silicon oxide films as masks. The substrate is subjected to cause an activation of the source/drain diffusion regions and a diffusion of the impurity of the second conductivity type. Semiconductor epitaxial layers are formed on the source/drain regions under conditions of a high selectivity to silicon oxide of the side wall silicon oxide films so that the semiconductor epitaxial layers have facets which face to the side wall silicon oxide films and the facets are almost linearly sloped down to bottom portions of the side wall silicon oxide films. The impurity of the first conductivity type is implanted into the substrate at its limited positions in the vicinity of the inside edge portion of the source/drain regions by using the semiconductor epitaxial layers with the facets and the side wall silicon oxide films as masks in an oblique direction tilted by a tilting angle $\theta$ from the normal of a surface of the substrate wherein the angle $\theta$ satisfies an equation represented by $\theta \leq \theta_1$ where: $\theta_1$ is an angle by which the facets are tilted from the normal of the surface of the substrate, and wherein a thickness of the silicon selective growth layers satisfies an equation represented by Tepi>(Xj'/tan $\theta$)–Xj where: Tepi is the thickness of the silicon selective growth layers except for the facet portions; Xj is a junction depth of the source/drain diffusion regions; and Xj' is a distance between a top edge portion of each of the source/drain diffusion regions and a bottom side edge of each of the side wall silicon oxide films.

The present invention also provides a MOS field effect transistor comprises the following elements. A gate oxide film is selectively provided on the semiconductor substrate of a first conductivity type. A gate electrode is provided on the gate oxide film. Side wall silicon oxide films is selectively formed at opposite sides of the gate electrode. Source/drain diffusion regions of a second conductivity type are provided selectively in an upper region of the semiconductor substrate. Semiconductor epitaxial layers are provided on the source/drain regions. The semiconductor epitaxial layers have facets which face to the side wall silicon oxide films and the facets are almost linearly sloped down to bottom portions of the side wall silicon oxide films. Pocket regions of the first conductivity type extend in the substrate at its limited positions along an inside edge portion of the source/drain regions. The pocket regions have bottoms positioned at a depth, wherein Xpocket<Tepi+Xj where: Tepi is a thickness of the semiconductor selective growth layers except for the facet portions; Xj is a p-n junction depth of the source/drain regions; and Xpocket is a depth at which bottoms of the pocket regions are leveled.

PREFERRED EMBODIMENT

A preferred embodiment according to the present invention will be described in detail with reference to FIGS. 5A through 5F, in which there is provided a novel fabrication method for fabricating a MOS field effect transistor with an improved pocket structure.

Figure 5A:
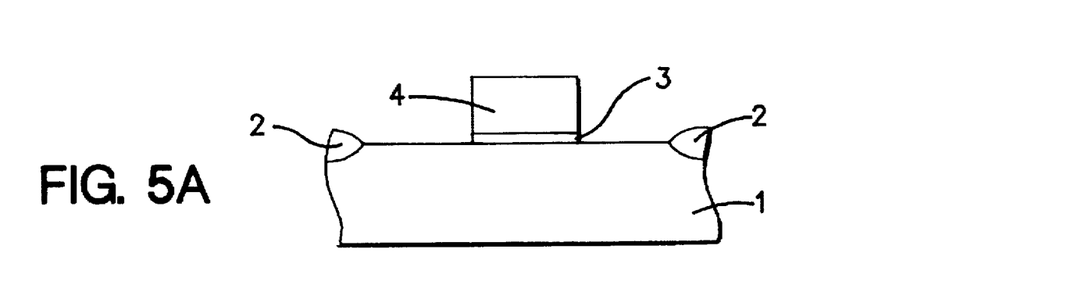
FIGS. 5A through 5F are fragmentary cross sectional elevation views illustrative of MOS field effect transistors with pocket regions in sequential processes involved in a novel fabrication method in a preferred embodiment according to the present invention.

With reference to FIG. 5A, field oxide films 2 are selectively formed on a surface of a p(100) silicon substrate 1 by use of a local oxidation of silicon. The silicon substrate 1 is subjected to a B+-implantation to adjust a threshold voltage. A gate oxide film 3 having a thickness of 5 nanometers is formed on a surface of the silicon substrate 1 by use of a thermal oxidation of silicon. A polysilicon film having a thickness of 150 nanometers is deposited on the gate oxide film 3. Subsequently, the gate oxide film 3 and the polysilicon film are patterned by a photo-lithography and an anisotropic etching to form a polysilicon gate electrode 4.

Figure 5B:
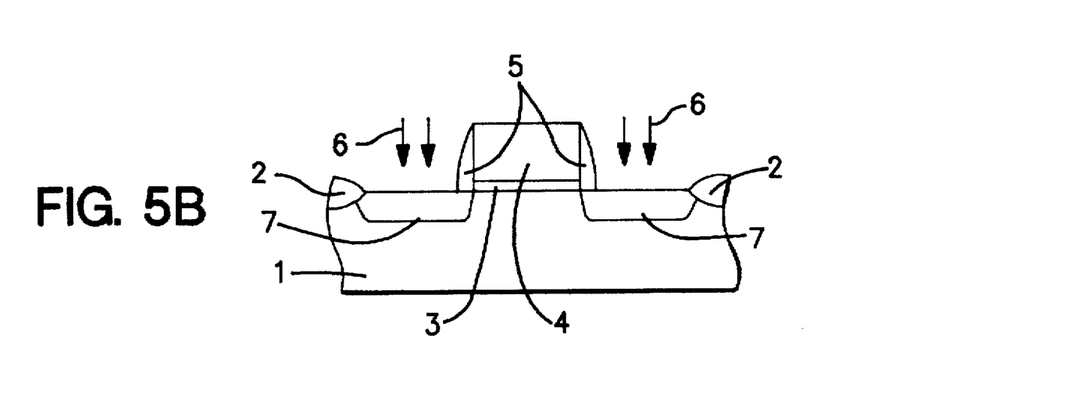

With reference to FIG. 5B, a silicon oxide film having a thickness of 60 nanometers is deposited on an entire surface of the substrate 1 by a chemical vapor deposition. The silicon oxide film is then subjected to an anisotropic etching to thereby form silicon oxide side walls 5 at opposite sides of the gate electrode 4. By use of the gate electrode 4 and the silicon oxide side walls 5 as a mask, the substrate 1 is subjected to an ion-implantation of an impurity As$^+$ 6 at an energy of 30 keV and a dose of $3\times10^{15}$ cm$^{-2}$ in a direction just vertical to a surface of the substrate 1. Namely, the ion-implantation is carried out in a direction tilted by an angle of 0 degree from the normal of the surface of the substrate 1 thereby forming source/drain regions 7. Subsequently, the substrate 1 is subjected to a heat treatment in a nitrogen atmosphere at a temperature of 1000° C. to activate the source/drain regions 7. As a result, the impurity As$^+$ 6 is diffused so that edge portions of the source/drain regions 7 extends under the side wall silicon oxide films 5. By use of fluorine acid, spontaneous silicon oxide films formed on surfaces of the source/drain regions 7 are then removed.

Figure 5C:
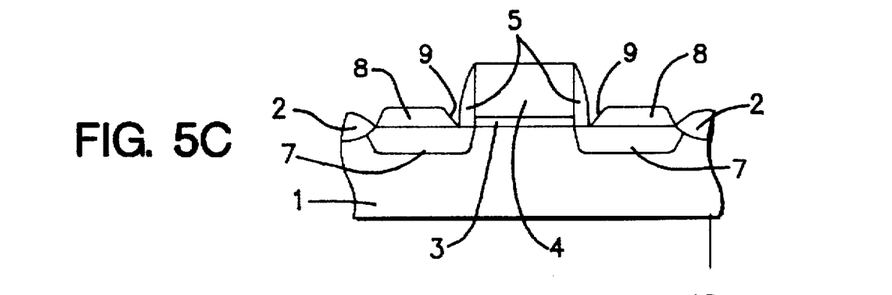

With reference to FIG. 5C, by use of a chemical vapor deposition method, silicon selective growth layers 8 are formed on the source/drain regions 7 under conditions of a high selectivity to silicon oxide of the side wall silicon oxide films 5. The silicon selective growth layers 8 have facets 9 which face to the side wall silicon oxide films 5, wherein the facets 9 of the silicon selective growth layers 8 are almost linearly sloped down to the bottom portion of the side wall silicon oxide films 5. The silicon selective growth layers 8 have a thickness of 50 nanometers. This silicon selective growth layers 8 may be replaced by other semiconductor selective growth layers.

Figure 5D:
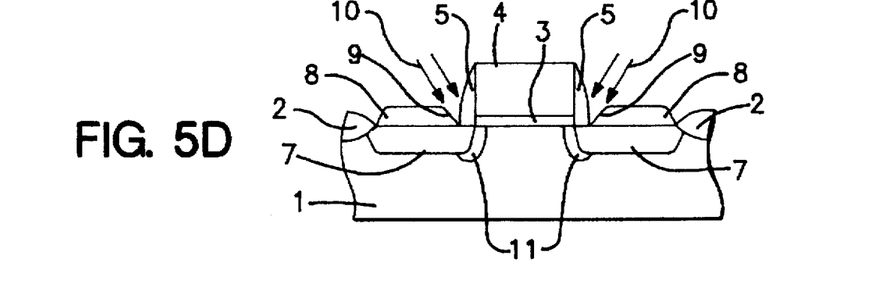

With reference to FIG. 5D, by use of the silicon selective growth layers 8 and the side wall silicon oxide films 5 as masks, the substrate 1 is subjected to an ion-implantation of an impurity BF$_2^+$ 10 at an implantation energy of 30 keg and a dose of $3\times10^{13}$ cm$^{-2}$ in an oblique direction tilted by a tilting angle of 40 degrees from the normal of the surface wherein the substrate 1 is made rotate to thereby implant the impurity BF$_2^+$ 10 only local and limited portions in the vicinity of the inside edge portions of the source/drain regions 7.

Figure 5E:
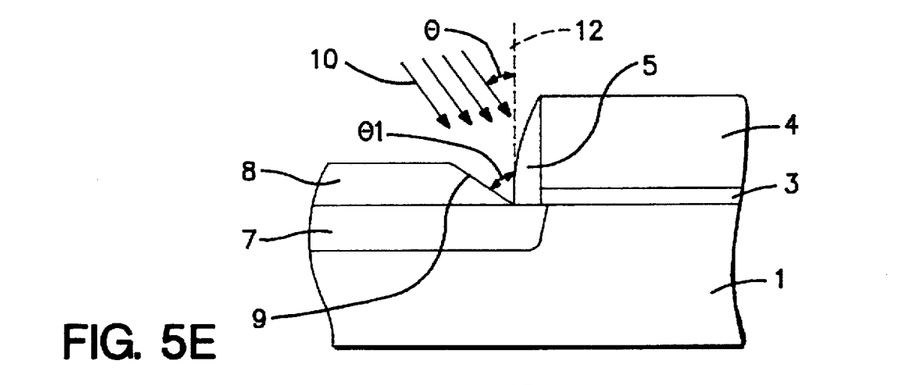

With reference to FIG. 5E, the angle $\theta$ by which the direction of the ion-implantation of the impurity BF$_2^+$ 10 is tilted from the normal of the surface of the substrate 1, has to be decided to satisfy the following equation.

$\theta \leq \theta_1$ where $\theta_1$ is the angle by which the facets 9 of the silicon selective growth layers 8 are tilted from the normal of the surface of the substrate 1 to allow the impurity BF$_2^+$ 10 to be implanted only into positions in the vicinity of the inside edge portions of the source/drain regions 7.

Figure 5F:
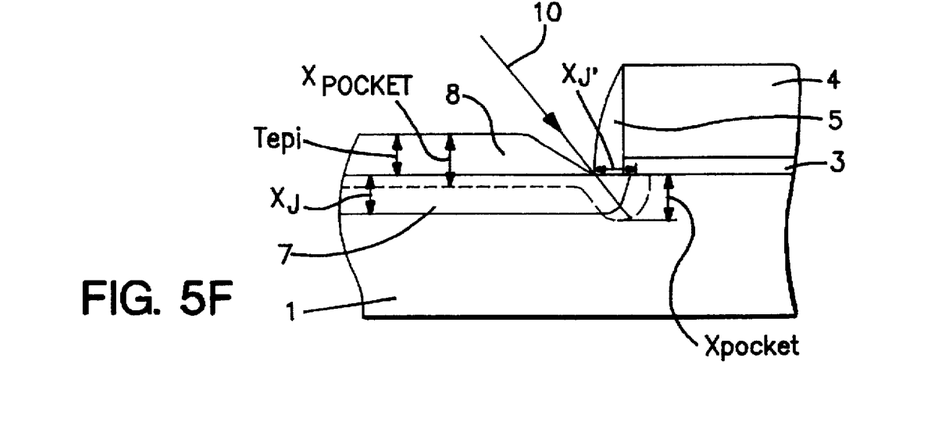

With reference to FIG. 5F, a thickness Tepi of the silicon selective growth layers 8 are decided to satisfy the following equations.

Tepi>(Xj'/tan $\theta$)–Xj where Tepi is the thickness of the silicon selective growth layers 8 except for the facet portions 9, Xj is the junction depth of the source/drain diffusion regions 7. Xj' is the distance between the top edge portion of each of the source/drain diffusion regions 7 and the bottom side edge of each of the side wall silicon oxide films 5, and θ is the angle by which the direction of the ion-implantation of the impurity $BF_2^+$ 10 is tired from the normal of the surface of the substrate 1. The reason why it is necessary to satisfy the above relationship represented by the above equation is as follows.

It is required to implant the impurity $BF_2^+$ 10 only into local and limited positions in the vicinity of the inside edge portions of the source/drain regions 7 so as to form pocket regions 11 only at local and limited positions in the vicinity of the inside edge portions of the source/drain regions 7. In order to satisfy this requirement, it is required to satisfy the following equation.

Xpocket>Xj'/tan θ where 19 is the angle by which the direction of the ion-implantation of the impurity $BF_2^+$ 10 is tilted from the normal of the surface of the substrate. Xj' is the distance between the top edge portion of each of the source/drain diffusion regions 7 and the bottom side edge of each of the side wall silicon oxide films 5, and Xpocket is the mean depth of the impurity $BF_2^+$ 10 implanted from the surface of the device.

It is required to satisfy the following equation in order to selectively implant the impurity $BF_2^+$ 10 only into local and limited positions in the vicinity of the inside edge portions of the source/drain regions 7 so as to form the pocket regions 11 only at local and limited positions in the vicinity of the inside edge portions of the source/drain regions 7.

Xpocket<Tepi+Xj where Tepi is the thickness of the silicon selective growth layers 8 except for the facet portions 9.

In order to satisfy both the above equations Xpocket>Xj'/tan θ and Xpocket<Tepi+Xj, it is required to satisfy the following equation.

Tepi>(Xj'/tan θ)−Xj.

After the above described ion-implantation of the impurity $BF_2^+$ 10 is carried out to form the pocket regions 11, the substrate is then subjected to a heat treatment at a temperature of 1000° C. for 10 seconds in a nitrogen atmosphere.

In accordance with the above method, it is possible to form the pocket regions 11 only at local and limited positions in the vicinity of the inside edge portions of the source/drain regions 7 by using the silicon selective growth layers 8 with the facet portions 9 and the side wall silicon oxide film as masks. This prevents any enlargement in a p-n junction capacitance between the source/drain regions and the pocket regions in the MOS transistor.

What is claimed is:

1. A method for ion-implantation of an impurity of a first conductivity into a substrate of the same conductivity type as said first conductivity to form pocket regions at limited positions in the vicinity of an inside edge portion of source/drain re.regions of a second conductivity type in a MOS field effect transistor having a gate electrode with side wall silicon oxide films, said method comprising the steps of:

forming semiconductor epitaxial layers on said source/drain regions under conditions of a high selectivity to silicon oxide of said side wall silicon oxide films so that said semiconductor epitaxial layers have facets which face to said side wall silicon oxide films and said facets are almost linearly sloped down to bottom portions of said side wall silicon oxide films; and     implanting said impurity of said first conductivity type into said substrate at its limited positions in the vicinity of said inside edge portion of said source/drain regions by using said semiconductor epitaxial layers with said facets and said side wall silicon oxide films as masks in an oblique direction tilted by a tilting angle θ from the normal of a surface of said substrate,     wherein said angle θ satisfies an equation represented by θ≦θ₁ where: (θ₁ is an angle by which said facets are tilted from the normal of said surface of said substrate, and     wherein a thickness of said silicon selective growth layers satisfies an equation represented by Tepi>(Xj'/tan θ)−Xj where: Tepi is said thickness of said silicon selective growth layers except for said facet portions; Xj is a junction depth of said source/drain diffusion regions; and Xj' is a distance between a top edge portion of each of said source/drain diffusion regions and a bottom side edge of each of said side wall silicon oxide films.

2. The method as claimed in claim 1, wherein said angle θ is 40 degrees.

3. The method as claimed in claim 1, wherein said impurity of said first conductivity type is implanted during a rotation of said substrate.

4. A method for forming pocket regions of a first conductivity type in a substrate of said first conductivity type at its limited positions in the vicinity of an inside edge portion of source/drain regions of a second conductivity type in a MOS field effect transistor having a gate electrode with side wall silicon oxide films, said method comprising the steps of:

forming semiconductor epitaxial layers on said source/drain regions under conditions of a high selectivity to silicon oxide of said side wall silicon oxide films so that said semiconductor epitaxial layers have facets which face to said side wall silicon oxide films and said facets are almost linearly sloped down to bottom portions of said side wall silicon oxide films; and     implanting said impurity of said first conductivity type into said substrate at its limited positions in the vicinity of said inside edge portion of said source/drain regions by using said semiconductor epitaxial layers with said facets and said side wall silicon oxide films as masks m an oblique direction tilted by a tilting angle θ from the normal of a surface of said substrate,     wherein said angle θ satisfies an equation represented by θ≦θ₁ where:θ₁ is an angle by which said facets are tilted from the normal of said surface of said substrate, and     wherein a thickness of said silicon selective growth layers satisfies an equation represented by Tepi>(Xj'/tan θ)−Xj where: Tepi is said thickness of said silicon selective growth layers except for said facet portions; Xj is a junction depth of said source/drain diffusion regions; and Xj' is a distance between a top edge portion of each of said source/drain diffusion regions and a bottom side edge of each of said side wall silicon oxide films.

5. The method as claimed in claim 4, wherein said angle θ is 40 degrees.

6. The method as claimed in claim 4, wherein said impurity of said first conductivity type is implanted during a rotation of said substrate.

7. A method for fabricating a MOS field effect transistor with pocket regions of a first conductivity type in a substrate of said first conductivity type at its limited positions m the vicinity of an inside edge portion of source/drain regions of a second conductivity type, said method comprising the steps of:

forming a gate electrode on a gate oxide film over a semiconductor substrate;

forming side wall silicon oxide films at opposite sides of said gate electrode;

forming source/drain diffusion regions by ion-implantation of an impurity of said second conductivity type into said substrate in a direction vertical to a surface of said substrate by use of said gate electrode and said side wall silicon oxide films as masks;

subjecting said substrate to cause an activation of said source/drain diffusion regions and a diffusion of said impurity of said second conductivity type;

forming semiconductor epitaxial layers on said source/drain regions under conditions of a high selectivity to silicon oxide of said side wall silicon oxide films so that said semiconductor epitaxial layers to said side wall sch face to said side wall silicon oxide films and said facets are almost linearly sloped down to bottom portions of said side wall silicon oxide films; and implanting said impurity of said first conductivity type into said substrate at its limited positions in the vicinity of said inside edge portion of said source/drain regions by using said semiconductor epitaxial layers with said facets and said side wall silicon oxide films as masks in an oblique direction tilted by a tilting angle $\theta$ from the normal of a surface of said substrate.

wherein said angle $\theta$ satisfies an equation represented by $\theta \leq \theta_1$ where: $\theta_1$ is an angle by which said facets are tilted from the normal of said surface of said substrate, and wherein a thickness of said silicon selective growth layers satisfies an equation represented by $Tepi > (Xj'/\tan\theta) - Xj$ where: Tepi is said thickness of said silicon selective growth layers except for said facet portions; Xj is a junction depth of said source/drain diffusion regions; and Xj' is a distance between a top edge portion of each of said source/drain diffusion regions and a bottom side edge of each of said side wall silicon oxide films.

8. The method as claimed in claim 7, wherein said angle $\theta$ is 40 degrees.

9. The method as claimed in claim 7, wherein said impurity of said first conductivity type is implanted during a rotation of said substrate.

* * * * *